US006508664B2

(12) United States Patent
Phalen

(10) Patent No.: US 6,508,664 B2
(45) Date of Patent: Jan. 21, 2003

(54) CONNECTORS FOR CIRCUIT BOARDS CONFIGURED WITH FOIL ON BOTH SIDES

(75) Inventor: Michael Dennis Phalen, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/851,393

(22) Filed: May 9, 2001

(65) Prior Publication Data

US 2002/0168883 A1 Nov. 14, 2002

(51) Int. Cl.[7] .............................................. H01R 11/00
(52) U.S. Cl. ...................................................... 439/502
(58) Field of Search ................................ 439/502, 636, 439/510–512

(56) References Cited

U.S. PATENT DOCUMENTS 3,492,538 A * 1/1970 Fergusson
4,250,536 A * 2/1981 Barringer et al. ........... 361/413

OTHER PUBLICATIONS

IBM Technical Bulletin, vol. 7, No. 3, Aug. 1964.*

* cited by examiner

Primary Examiner—Khiem Nguyen
(74) Attorney, Agent, or Firm—Jimmy L. Funke; Stefan V. Chmielewski

(57) ABSTRACT

A contact assembly for a circuit board includes a first side with a conductive pad disposed thereon and a second side also having a conductive pad disposed thereon. The contact assembly further includes a conductive contact member. The conductive contact member has an arm with a central portion and an end portion adjacent to the central portion. The contact member also has a second arm which has a central portion and an end adjacent to that central portion. The conductive contact member also includes a junction at the connection between the two arms. The conductive contact member is designed to contact the circuit board. When implemented, it electrically connect the two conductive pads of the circuit board. This attachment creates a complete circuit between the two sides of the circuit board. Additionally, a holder member is coupled to the conductive contact member substantially near the junction and substantially opposite the circuit board.

5 Claims, 2 Drawing Sheets

CONNECTORS FOR CIRCUIT BOARDS CONFIGURED WITH FOIL ON BOTH SIDES

TECHNICAL FIELD

The present invention relates generally to contact assemblies, and more particularly, to a contact assembly that will simultaneously connect two sides of a circuit board with foil on both sides.

BACKGROUND ART

It is well known in the electronic field that two single sided circuit boards may be electrically connected through contacts or wires. It is also well known in the electronic field that double sided circuit boards save space via electrical contacts on each side of the board to complete a circuit.

Prior contact assemblies typically completed a circuit by connecting two single sided circuit boards together with each having contacts on only one side. This was typically done by attaching a contact or wire from the portion on the first board to the portion on the second board where continuity was required.

Often, there are limitations on space such that two single sided circuit boards would exceed those limits. Therefore, double sided circuit boards (referred to herein as circuit boards having foil on both sides) have been employed that contain all the components that the two separate circuit boards contained. The components for one of the circuit boards are placed on the first side of the double sided circuit board and the components for the other circuit board are placed on the second side of the double sided circuit board.

The current method for completing a circuit between the two sides of a double sided circuit board, however, has shortcomings. Initially, contact is commonly made between the opposing sides of a circuit board by plated through hole substrates. With this method, holes are drilled in the sections of the circuit board where contact with the opposing sides is desired. Then, the hole is filled with a conductive material to complete the circuit. This process is costly and time consuming.

The disadvantages associated with this conventional contacting assembly have made it apparent that a new technique for creating contacts between sides of a double sided circuit board would be beneficial.

SUMMARY OF THE INVENTION

It is, therefore, an object of the invention to provide an improved, reliable and less expensive contact assembly.

In accordance with the above and other objects of the present invention, a contact assembly for a circuit board having a first side with a first conductive pad disposed thereon and a second side having a second conductive pad disposed thereon is disclosed. The contact assembly includes a conductive contact member. The conductive contact member has a first arm with a first central portion and a first end adjacent to the first central portion. The contact member also has a second arm having a second central portion and a second end adjacent to the second central portion. The conductive contact member also includes a junction at the connection between the first arm and the second arm. The conductive contact member is designed to contact the circuit board and electrically connect the first conductive pad and the second conductive pad of the circuit board. This attachment creates a complete circuit between the two sides of the circuit board. A holder member is coupled to the conductive contact member substantially near the junction and substantially opposite the circuit board.

In a further embodiment of the invention, a plurality of conductive contact members are aligned with a plurality of pads on the circuit board. The plurality of conductive contact members are then electrically coupled with the circuit board. Resultantly, a circuit is completed between the first side and the second side of the circuit board.

Additional advantages and features of the present invention will become apparent from the description that follows and may be realized by the instrumentalities and combinations particularly pointed out in the appended claims, taken in conjunction with the accompanying drawings.

BRIEF DESCRIPTION OF THE DRAWINGS

For a more complete understanding of the invention, there will now be described some embodiments thereof, given by way of example, reference being made to the accompanying drawings, in which.

DETAILED DESCRIPTION OF THE PREFERRED EMBODIMENT

Figure 1:
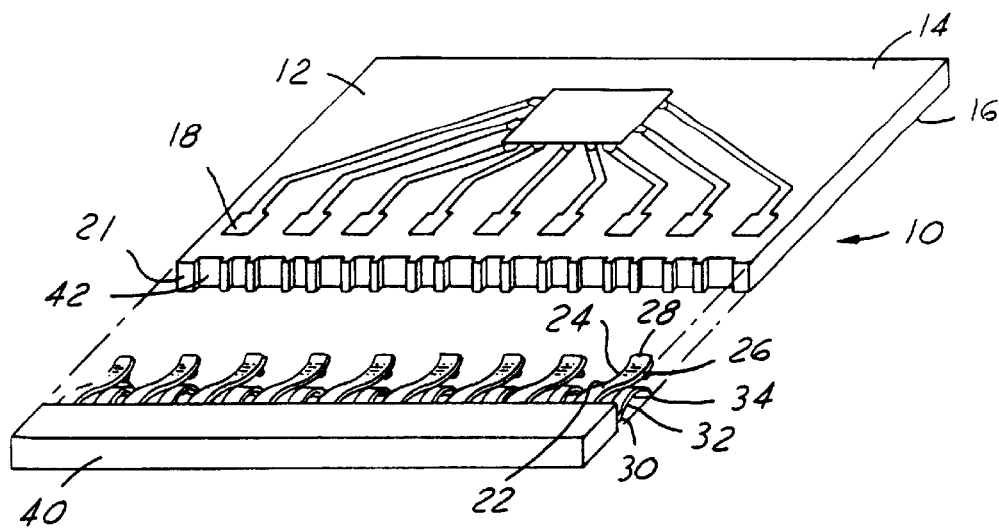
FIG. 1 is a perspective view that illustrates a contact assembly in accordance with one embodiment of the present invention.
Figure 2:
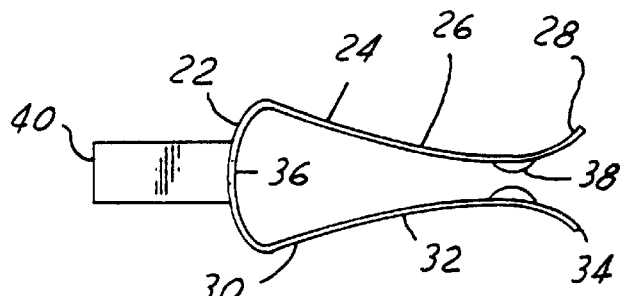
FIG. 2 is a side view of a conductive contact member in accordance with one embodiment of the present invention.
Figure 3:
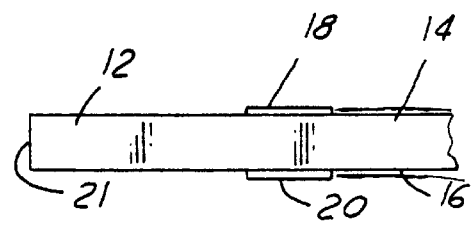
FIG. 3 is a side view of a portion of a circuit board with a first conductive pad on a first side of the circuit board and a second conductive pad on the second side of the circuit board in accordance with one embodiment of the present invention.
Figure 4:
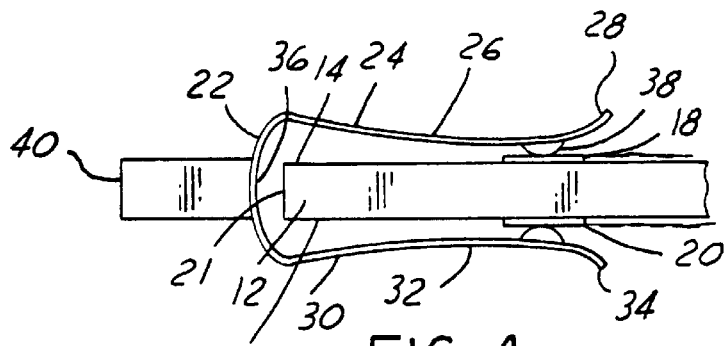
FIG. 4 is a side view of the assembly of the components in FIG. 2 and FIG. 3 in a position to complete an electrical connection in accordance with one embodiment of the present invention.

The present invention is illustrated with respect to a contact assembly 10, particularly suited for the electronics field. However, the present invention is applicable to various other uses that may require electrical contacts, as will be understood by one skilled in the art.

Referring to FIGS. 1 through 4, a contact assembly 10 in accordance with one embodiment of the present invention is illustrated. The contact assembly 10 includes a circuit board 12 having a first side 14 and a second side 16 opposite the first side 14. The first side 14 has a first set of conductive pads 18 disposed thereon, and the second side 16 has a second set of conductive pads 20 disposed thereon. The sets of conductive pads 18, 20 are arranged substantially near a first edge 21 of the circuit board 12 and are aligned substantially in a row. The sets of contact pads 18, 20 are each in communication with respective traces 19 so as to complete an electrical connection. Further, it should be understood that the arrangement and location of the pads 18, 20, and traces 19, on the circuit board 12 is not critical. However, the spacing must be such that the soldering operations of the contact members 22 to the circuit board 12 will not allow the contact members 22 to bridge the solder. Almost any soldering process will satisfy the contact assembly 10 requirements. However, one typical soldering operation used is wave soldering, which simplifies assembly because the contact members 22 are not masked during the soldering process.

The contact assembly 10 is shown with a plurality of conductive contact members 22. However, the invention can be illustrated by a single conductive contact member 22. The conductive contact member 22 is intended to engage the circuit board 12. The conductive contact member 22 has a first arm 24 with a first central portion 26 and a first end 28 adjacent to the first central portion 26. The conductive contact member 22 also has a second arm 30 having a second central portion 32 and a second end 34 adjacent to the second central portion 32. The conductive contact member 22 has a junction 36 which is located between and which connects the first arm 24 and the second arm 30.

Each conductive contact member 22 further includes a dimple 38 which is located at the end 28 of the first arm 24. The dimple 38 is, ideally, formed into at least one end 28 of one of the arms 24 through pressing of the conductive material of the contact member 22. However, the dimple may be coupled to the contact member 22 through other attachment methods, such as soldering or welding processes. The central portions of the contact members 26, 32 are preferably slightly angled toward one another. Additionally, the ends 28, 34 are preferably slightly angled away from the respective central portions 26, 32 in a substantially perpendicular direction to a holder member 40. The holder member 40 or bandoleer is attached to the contact member 22 substantially near the junction 36 such that the holder member 40 is on the outer perimeter of the contact member 22, as is discussed in more detail below. While a specific arrangement of the contact members has been discussed, a variety of other arrangements are contemplated. However, the arrangement must allow for sufficient electrical contact between the contact members 26, 32 and the pads 18, 20.

The contact assembly 10 is preferably intended to function with a row of contact members 22 attached to the holder member 40. Also, both arms of the contact members 22 each preferably have dimples 38 on their ends 28, 34. The contact members 22 preferably include at least one end 28 angled from the respective central portion 26 of the arm 24. This angling facilitates guiding of the conductive contact member 22 onto the circuit board 12 or other device that requires contact from one half to another. Some alternate embodiments of the shape of the arms will be discussed later, however, there is an almost unlimited number of shapes that can be utilized to achieve the objects of the present invention. For example, one of the arms 24, 30, can be flat while the other arm 24, 30 can be curved or have a spring.

To further embody the assembly 10, the holder member 40 is coupled to at least one conductive contact member 22. However, the invention is most useful with a row of conductive contact members 22 attached to the holder member 40. The holder member 40 is preferably integrally attached at the junction 36 of a pair of contact arms 24, 30 (although, the holder member 40 may alternatively be placed at various other points on the contact member such as at a central portion 26, 32). This is accomplished during the forming process of the arms 24, 30. When the contact arms 24, 30 are formed, such as during stamping, the holder member 40 is also stamped from the same material. This allows the contact member 22 to be formed as a strip and be easily placed on the circuit board around the perimeter of the substrate and engage both the top and bottom contact pads 18, 20. The holder member 40 is, preferably, removable from the contact member 22 through a punching process. However, the contact members 22 can be separated from one another by a variety of known processes that separate the holder member 40 between each of the respective contact members 22. Further, the assembly 10 may alternately be embodied to operate with a ground plane on the second side 16 of the circuit board 12. The holder member 40 is preferably made out of the same conductive material as the contact members 22 and is formed together with the contact members 22. Alternatively, the holder member 40 may be made out of an insulating substance such as a plastic polymer. Preferably, also, the holder member 40 is flexible to facilitate coupling the row of contact members 22 with the circuit board 12. However, a rigid holder member 40 would also work for some embodiments of the assembly 10 such as when the assembly 10 requires a conductive holder member 40. Additionally, the row of conductive contact members 22 is embodied as the length the circuit board 12 requires.

The arms of the contact member 22 and the dimple 38 are made from a conductive material. Also, the contact member 22 is, preferably, flexible at least at the junction 36 such that the first arm 24 has a spring force urging the circuit board 12 toward the second arm 30.

The circuit board 12, used in the current embodiment, has indentations 42 on the edge 21 of the circuit board 12 to which the contact members 22 are aligned and attached. The contact members 22 fit into these indentations preferably at the junctions 36 of the contact members 22. These indentations 42 create an almost sheer edge surface on the circuit board 12 when the contact members 22 are slid fully onto the circuit board 12. Additionally, the indentations 42 are ideally designed such that a second series of indentations on the circuit board, aligned with the first series of indentations 42, receive a detaching component from an external detaching mechanism. Subsequently, the second series of indentations illustrated provide leverage for the detaching mechanism to remove the holder member 40. In an alternate embodiment, the contact members 22 attach to a circuit board without indentations 42.

To assemble the contact assembly 10, the conductive contact member 22 is electrically coupled with the double sided circuit board 12. The circuit board 12 includes a first side 14 having a first conductive pad 18 and a second side 16 having a second conductive pad 20. The first arm 24 of the contact member 22 contacts the first conductive pad 18, and the second arm 30 contacts the second conductive pad 20 to form a conductive junction between the two conductive pads. However, the second side also works well as a ground plane and does not require a second pad 20. During the coupling step, the first arm 24 has a spring force urging the circuit board 12 towards the second arm 30. This pressure exerted on the circuit board 12 at the dimple 38 of the contact member 22 causes oxidation on the first conductive pad 18 and the contact member 22 to be scraped away when the contact member 22 is slid onto the circuit board 12. This scraping of oxidation aids in continuity between the contact member 22 and the pad 18. The contact assembly 10 also works well when the pads are soldered to the ends of the arms of the contact member 22. However, this soldering requires that contact members 22 be far enough away from one another to avoid a short circuit (and to meet customer requirements for electromagnetic compatibility), as will be understood by one skilled in the art. However, an airtight seal is formed between the contact members 22 and the circuit board 12 through the scraping of oxidation mentioned above. The solder used primarily to contribute to the robustness of the contact assembly 10.

Figure 5:
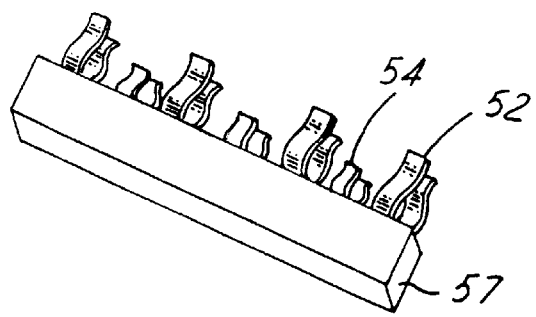
FIG. 5 is a perspective view of a plurality of conductive contact members in accordance with another embodiment of the present invention.

Referring to FIG. 5, a perspective view of a plurality of conductive contact members in accordance with another embodiment of the present invention is illustrated. In this embodiment, the holder 57 has contact members 52, 54 with arms of different lengths. As shown, some of the contact members 52 are longer and some of the contact members 54 are shorter. This embodiment is one example of how varying the lengths of the contact members creates different circuit board 12 configuration options. By this configuration, the contact members 52, 54 can engage contacts that are on a circuit board in a variety of locations.

Figure 6:
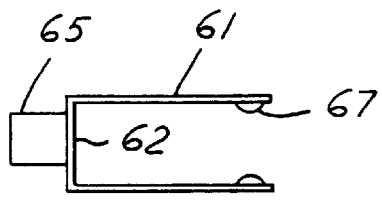
FIG. 6 is a side view of a conductive contact member in accordance with another embodiment of the present invention.
Figure 7:
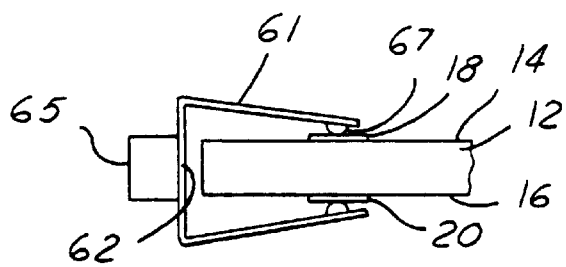
FIG. 7 is a side view of an assembly of a conductive contact member in a position to complete an electrical connection with the portion of the circuit board shown in FIG. 3 in accordance with another embodiment of the present invention.

Referring to FIGS. 6 and 7, a contact assembly in accordance with another embodiment of the present invention is illustrated. Here, the contact members 61 are straight. Also, here, unlike in FIGS. 1 through 4, the stress point is not at the junction 62, it is on either side of the holder member 65. In this embodiment, the contact member 61 does not slide on to the circuit board 12. The contact member 61 is clamped down to the first side 14 of the circuit board 12 and the second side 16 of the circuit board 12 so the dimples 67 contact the first conductive pad 18 and the second conductive pad 20. In this embodiment, the holder member 65 is preferably made from an insulating substance, as described above. The insulating substance is preferably affixed to the conductive members by an adhesive or alternatively is injection molded thereto or attached by other known means.

From the foregoing, it can be seen that there has been brought to the art a new and improved contact assembly 10. It is to be understood that the preceding description of the preferred embodiment is merely illustrative of some of the many specific embodiments that represent applications of the principles of the present invention. Numerous and other arrangements would be evident to those skilled in the art without departing from the scope of the invention as defined by the following claims.

What is claimed is:

1. A contact assembly for a circuit board having a first side having a first conductive pad thereon and a second side having a second conductive pad thereon comprising: a conductive contact member having a first arm with a first central portion and a first end adjacent to said first central portion and a second arm having a second central portion and a second end adjacent to said second central portion; a protruding dimple formed on said first arm, and a protruding dimple formed on said second arm; said conductive contact member having a junction between said first arm and said second arm; a holder member that is coupled to said conductive contact member; whereby said conductive contact member creates a complete circuit between the first conductive pad and the second conductive pad.

2. A system for causing electrical connection on a two sided circuit board comprising: a first side of a circuit board having a plurality of conductive pads; a plurality of conductive contact members having a first plurality of arms, said plurality of conductive contact members are adapted to be sheered on at least a portion of a plurality of indentations on said circuit board; a holder member removably coupled to said plurality of conductive contact members; wherein said first plurality of arms attaches to said plurality of conductive pads around at least one edge of said circuit board; thereby creating a conductive junction between said plurality of conductive contact members and said plurality of conductive pads on said circuit board.

3. The contact assembly as recited in claim 2, wherein said holder member is flexible.

4. The system as recited in claim 2, wherein said plurality of conductive contact members are different sizes.

5. A method for connecting a first side of a circuit board having a first plurality of conductive pads to a second side having a second plurality of conductive pads comprising: aligning a first side of a plurality of conductive contact members with the first plurality of conductive pads on the circuit board; aligning a second side of said plurality of conductive contact members with the second plurality of conductive pads on the circuit board; electrically coupling said plurality of conductive contact members with the circuit board through scraping off oxidation on the first plurality of conductive pads and through scraping off oxidation on the plurality of conductive contact members; completing a circuit between the first side of the circuit board and the second side in response to the step of electrically coupling.

* * * * *